United States Patent
Abouda et al.

(10) Patent No.: US 10,116,160 B2
(45) Date of Patent: Oct. 30, 2018

(54) CHARGING CIRCUIT, AN INDUCTIVE LOAD CONTROL CIRCUIT, AN INTERNAL COMBUSTION ENGINE, A VEHICLE AND A METHOD OF CHARGING A BOOTSTRAP STORAGE ELEMENT

(75) Inventors: Kamel Abouda, St Lys (FR); Estelle Huynh, Toulouse (FR); Thierry Laplagne, Cugnaux (FR)

(73) Assignee: NXP USA, Inc., Austin, TX (US)

( * ) Notice: Subject to any disclaimer, the term of this patent is extended or adjusted under 35 U.S.C. 154(b) by 584 days.

(21) Appl. No.: 14/423,481

(22) PCT Filed: Sep. 12, 2012

(86) PCT No.: PCT/IB2012/002024
§ 371 (c)(1),
(2), (4) Date: Feb. 24, 2015

(87) PCT Pub. No.: WO2014/041389
PCT Pub. Date: Mar. 20, 2014

(65) Prior Publication Data
US 2015/0188328 A1    Jul. 2, 2015

(51) Int. Cl.
*H02J 7/00* (2006.01)
*H02M 1/08* (2006.01)
(Continued)

(52) U.S. Cl.
CPC .............. *H02J 7/007* (2013.01); *F02D 41/20* (2013.01); *F02M 51/06* (2013.01); *H02M 1/08* (2013.01); *H02M 3/158* (2013.01); *H03K 17/063* (2013.01); *H03K 17/162* (2013.01); *F02D 2041/2006* (2013.01);
(Continued)

(58) Field of Classification Search
USPC .......................................... 320/104, 166–167
See application file for complete search history.

(56) References Cited

U.S. PATENT DOCUMENTS 6,331,763 B1 * 12/2001 Thomas ................. H02H 9/042
320/136
6,781,422 B1    8/2004 Yang
(Continued)

OTHER PUBLICATIONS

International Search Report and Written Opinion correlating to PCT/IB2012/002024 dated Mar. 28, 2013.

*Primary Examiner* — Samuel Berhanu
(74) *Attorney, Agent, or Firm* — Charlene R. Jacobsen

(57) ABSTRACT

A charging circuit for a bootstrap capacitor comprises a P MOSFET having a body diode and an N channel power MOSFET also having a body diode. The drain of the P MOSFET is coupled to the source of the N channel power MOSFET, and the source of the P MOSFET receives current from a vehicle's battery. The gate of the P MOSFET receives a control signal for turning the P MOSFET either on or off and the drain of the N channel power MOSFET is connected to a bootstrap capacitor The P MOSFET's body diode prevents current flow from the battery to the bootstrap capacitor when the P MOSFET is turned off and the N MOSFET's body diode prevents current flow from the bootstrap capacitor to the battery when the N MOSFET is turned off. The use of a power MOSFET device with its low ON resistance ensures that the capacitor is charged to a sufficiently high voltage even under low battery conditions.

11 Claims, 3 Drawing Sheets

(51) Int. Cl.
  *H03K 17/06* (2006.01)
  *H03K 17/16* (2006.01)
  *F02D 41/20* (2006.01)
  *F02M 51/06* (2006.01)
  *H02M 3/158* (2006.01)
  *H02M 3/155* (2006.01)
  *H02J 7/34* (2006.01)

(52) U.S. Cl.
  CPC ............... *F02D 2041/2013* (2013.01); *F02D 2041/2027* (2013.01); *F02D 2041/2075* (2013.01); *H02J 7/345* (2013.01); *H02M 3/155* (2013.01); *H03K 2217/0081* (2013.01)

(56) References Cited

U.S. PATENT DOCUMENTS

| | | |
|---|---|---|
| 7,710,167 B2 | 5/2010 | Bernacchia |
| 2004/0217737 A1* | 11/2004 | Popescu ............ H01M 10/4257 320/128 |
| 2006/0017466 A1 | 1/2006 | Bryson |
| 2008/0037807 A1 | 2/2008 | Honda |
| 2008/0116855 A1* | 5/2008 | Augesky ............ F02D 41/2096 320/166 |
| 2008/0303580 A1 | 12/2008 | Stegmayr |
| 2009/0108908 A1* | 4/2009 | Yamadaya ............ H02M 1/08 327/390 |
| 2009/0192695 A1 | 7/2009 | Machida |
| 2010/0066345 A1* | 3/2010 | Terry .................... H02J 7/0072 323/371 |
| 2012/0182772 A1* | 7/2012 | Hosokawa ............ H02M 7/538 363/56.12 |
| 2013/0134890 A1* | 5/2013 | Richter ............ H01J 37/32018 315/200 R |
| 2013/0293214 A1* | 11/2013 | Chang ................ H02M 3/1584 323/311 |
| 2014/0103845 A1* | 4/2014 | Bredemann ............ H02P 6/15 318/400.27 |
| 2017/0317583 A1* | 11/2017 | Forghani-Zadeh ......................... H03K 17/04206 |

* cited by examiner

CHARGING CIRCUIT, AN INDUCTIVE LOAD CONTROL CIRCUIT, AN INTERNAL COMBUSTION ENGINE, A VEHICLE AND A METHOD OF CHARGING A BOOTSTRAP STORAGE ELEMENT

FIELD OF THE INVENTION

This invention relates to a charging circuit, an inductive load control circuit, an internal combustion engine, a vehicle and a method of charging a bootstrap storage element.

BACKGROUND OF THE INVENTION

In an internal combustion engine, a fuel injector is provided for delivering a charge of fuel to a combustion chamber prior to ignition. One known type of injector behaves as an inductive load and comprises an electromagnetic valve which is configured to open when an electrical current is supplied to the injector and to remain closed when the current is interrupted. It is important to control the timing and delivery volume of a fuel injection event, and in order to achieve this an injector is provided with an associated control unit and driver circuit.

One known injector drive circuit is shown in FIG. 1 and indicated generally at 100. A similar arrangement is described in US-A-20090192695. In FIG. 1, an injector 101 is controlled by a high side driver circuit 102 and a low side driver circuit 103. The high side driver circuit 101 comprises a high side driver 104 and a first (high side) transistor 105. An output of the high side driver 104 is connected to the gate of the first transistor 105. The low side driver circuit 103 comprises a low side driver 106 and a second (low side) transistor 107. An output of the low side driver 106 is connected to the gate of the second transistor 107. The first and second transistors 105, 107 act as switches and may comprise N-channel MOSFET (metal oxide silicon field effect transistor) devices.

The first (high side) transistor 105 is arranged electrically upstream of the injector 101 on a power source side. The second (low side) transistor 107 is arranged electrically downstream of the injector 101 on a ground side.

In the example of FIG. 1, the high side driver 104 controls the gate of the first (high side) transistor 105 in a PWM (pulse width modulated) mode according to a PWM control signal which is applied to an input of the high side driver 104. The drain of the first (high side) transistor 105 is supplied by a "boost voltage" and the amount of current flowing through the injector 101 is then controlled by the PWM signal corresponding to the on-off periods of the first (high side) transistor switch 105. An additional low side driver control signal applied to the input of the low side driver 106 controls the gate of the second (low side) transistor 107. Typically, a "freewheeling" diode 108 is connected between the injector 101 and ground for discharging the inductor current inside the injector 101.

In the case where the first (high side) transistor 105 is an N-channel MOSFET, its gate needs to be at least 7 V (typical threshold voltage) higher than the boost voltage in order to guarantee switch-on in saturation mode. To fulfill this requirement, the known technique of providing a bootstrap charge storage element or "bootstrap capacitor" 109 can be employed for control of the gate of the first (high side) transistor 105. The bootstrap capacitor 109 is connected across the positive and negative supply rails of the high side driver 104 and is charged up by a voltage source 110 through a diode 111. In the automotive application, the voltage source may be provided by the vehicle's battery. By maintaining a suitable voltage across the bootstrap capacitor 109 it is possible to generate a gate voltage sufficiently high to force the high side transistor 105 into its saturation mode.

The use of the diode 111 prevents charge flowing back from the bootstrap capacitor 109 to the voltage source 110. However, the use of the diode is unsatisfactory in the case where the battery voltage is low, for example, during cranking of the engine. This is because of the inherent threshold voltage of the diode which causes a voltage drop across it, which in the case of low battery voltage, may mean that an insufficient voltage is applied to the bootstrap capacitor 109 for the purpose of driving the high side transistor 105 into saturation. There is a further automotive requirement for the injector control and drive circuitry to have high immunity to electrical interference. In particular, the bootstrap capacitor should not be discharged on occurrence of an electrical interference event. This can be a particular problem during idle mode where both high side and low side transistors 105, 107 are in the OFF mode and the high impedance state of the driver circuitry renders it more susceptible to interference.

SUMMARY OF THE INVENTION

The present invention provides a charging circuit, an inductive load control circuit, an internal combustion engine, a vehicle and a method as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Figure 1:
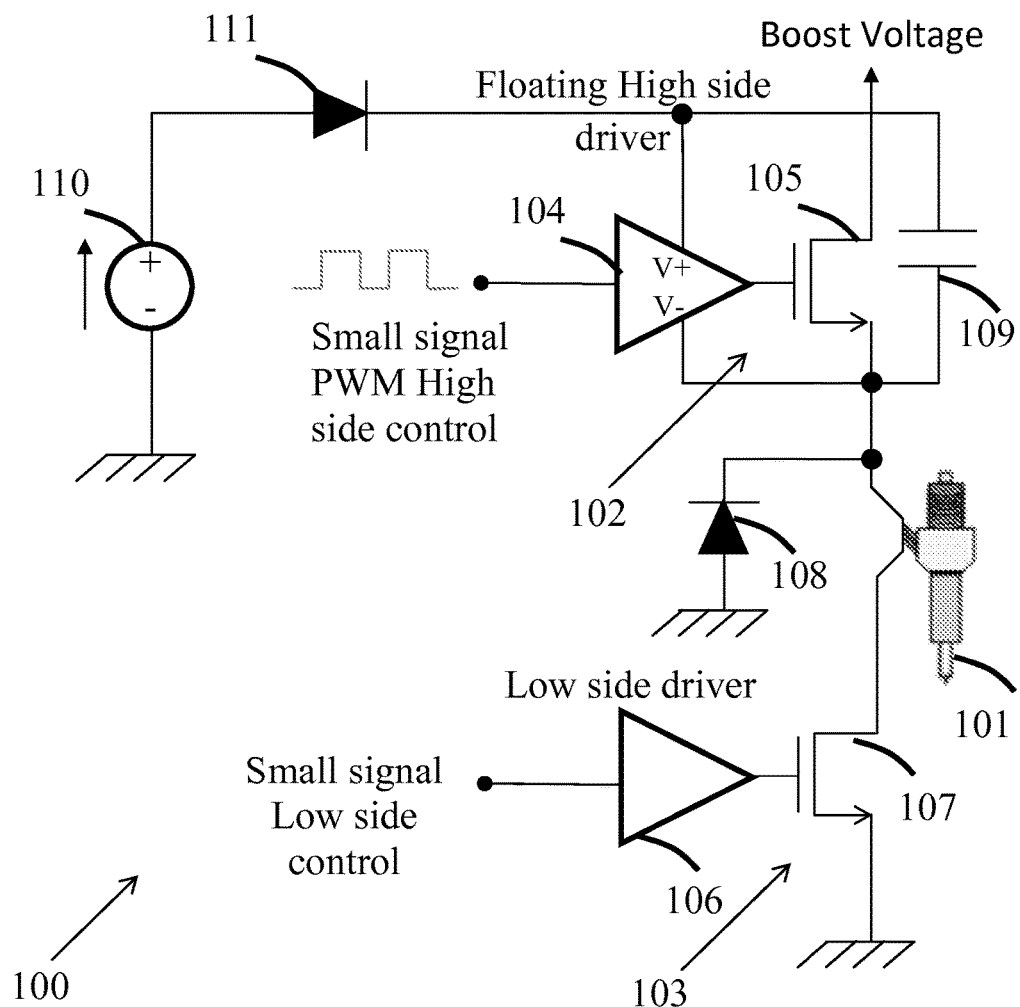
FIG. 1 is a simplified circuit diagram of an example of a known fuel injector drive circuit.

The present invention will now be elucidated with reference to a charging circuit for a bootstrap charge storage element, such as a bootstrap capacitor, within a driver circuit for an inductive load, which may be a fuel injector, for example, and a method therefore. However, it will be appreciated that the present invention is not limited to the specific embodiment illustrated in the drawings and described herein, and in particular is not limited to a method and apparatus for charging a bootstrap charge storage device within a driver circuit for an inductive load comprising a fuel injector, and may equally be implemented within a method and apparatus for charging a bootstrap charge storage device within any form of electrical load driver circuit. For example, it is contemplated that the present invention may alternatively be implemented within a charging circuit for charging a bootstrap charge storage device within a driver circuit for, say, an inertial or a capacitive load.

Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Figure 2:
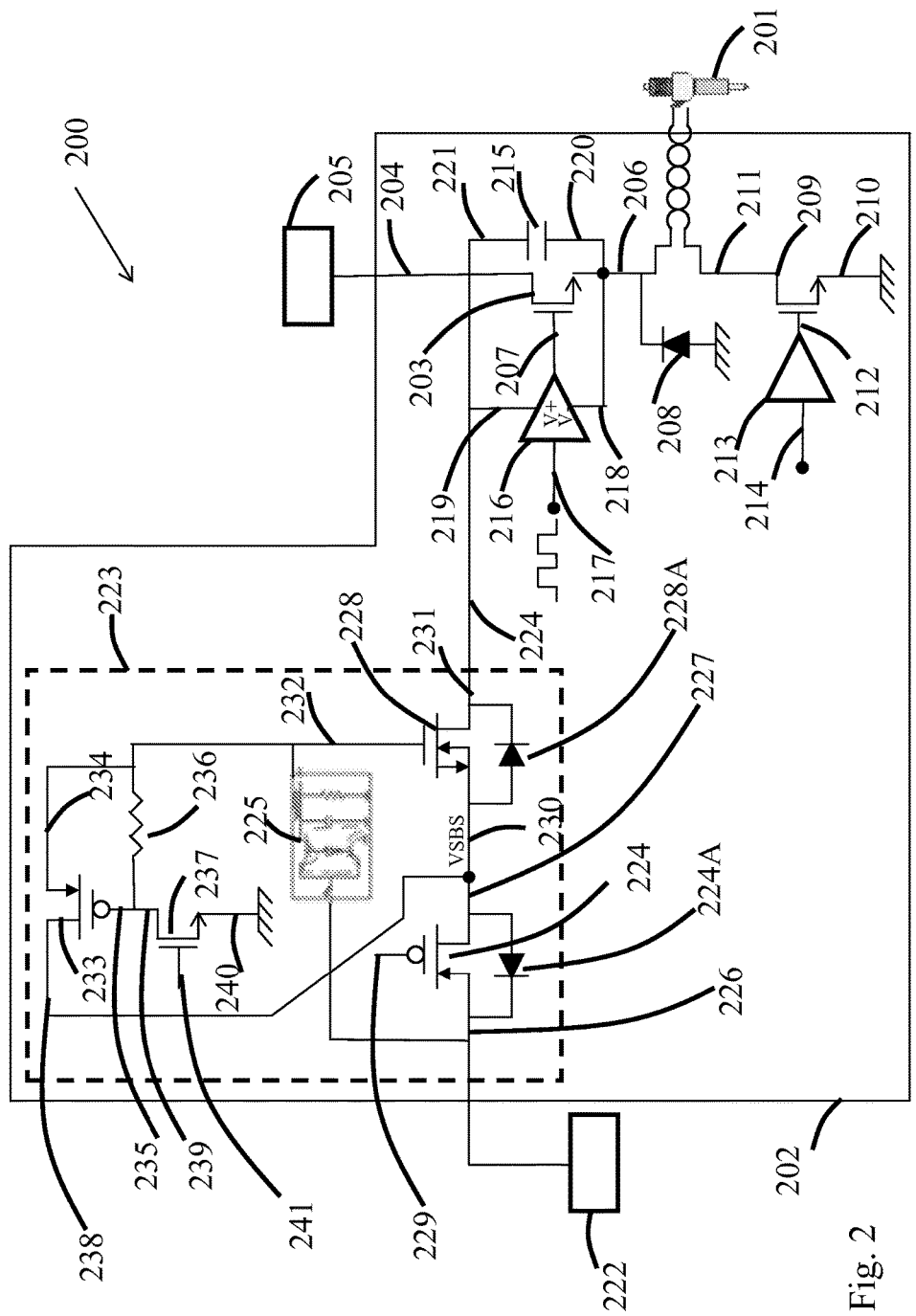
FIG. 2 is a simplified circuit diagram of an example of a driver circuit for an inductive load incorporating a bootstrap charge storage element charging circuit.

Referring now to FIG. 2, there is illustrated a simplified circuit diagram of an example of a driver circuit 200 for an inductive load, which in the illustrated example comprises a fuel injector 201 for an internal combustion engine of a motor vehicle, such as a car. The driver circuit 200 may be implemented within an integrated circuit device 202. The integrated circuit device 202 may comprise one or more dies provided in a single package, with electronic components provided on the dies that form the driver circuits and which are connectable to other components outside the package through suitable connections, such as pins of the package and bondwires between the pins and the dies.

The driver circuit 200 comprises a first switch, which in the illustrated example comprises a transistor operated as a switch, such as first n-channel metal oxide semiconductor (NMOS) device 203, such as an NMOS field effect transistor. A drain node 204, forming a first current terminal, of the first NMOS device 203 is operably coupled to a boost voltage supply 205. The boost voltage can be typically 65V and generated by a DC-DC converter (not shown) coupled to a battery (not shown) of the vehicle. A source node 206, forming a second current terminal, of the first NMOS device 203 is operably coupled to the fuel injector 201 and thus comprises an output of the first NMOS device 203. In this manner, the first NMOS device 203 is operably coupled between the fuel injector 201 and a positive supply voltage (the boost voltage 205), and as such comprises a high-side NMOS device, which is arranged to selectively couple the fuel injector 201 to the boost voltage 205 in accordance with a bias voltage received at a gate node 207, forming a control terminal, of the first NMOS device 203.

A freewheeling diode 208 has its cathode connected to the source node 206 and its anode connected to ground and permits discharging of the inductor inside the fuel injector.

The driver circuit 200 also comprises a second switch, such as a transistor operated as a switch, which in the illustrated example comprises a second n-channel metal oxide semiconductor (NMOS) device 209, such as an NMOS field effect transistor. A source node 210, forming a first current terminal of the second NMOS device 209, is operably coupled to ground. A drain node 211, forming a second current terminal of the second NMOS device 209, is operably coupled to the fuel injector 201. In this manner, the second NMOS device 203 is operably coupled between the fuel injector 201 and ground, and as such comprises a low-side NMOS device which is arranged to selectively couple the fuel injector 201 to ground in accordance with a bias voltage received at a gate node 212, forming a control terminal of the second NMOS device 209. In the illustrated example, the bias voltage applied to the gate node 212 of the second NMOS device 209 is supplied by a low side driver in the form of a low side buffer logic gate 213. This low side buffer logic gate is arranged to receive a low side control signal 214 and to output a corresponding control signal in the form of a bias voltage signal to the gate node 212 of the second NMOS device 213.

The driver circuit 200 of FIG. 2 comprises a bootstrap charge storage device, illustrated generally by way of bootstrap capacitor 215, which allows to generate a higher voltage level than the boost voltage 205, which otherwise would be the highest available supplied voltage. This allows to generate a voltage at the gate node 207 greater than the voltage at the drain node 204 (that is the boost voltage 205) plus the threshold voltage level ($V_{th}$) needed across the gate and source nodes 207, 206 to bias the NMOS device 203 into the saturation mode. In this respect, it should be noted that in this high-side configuration, when the first NMOS device 203 is in a fully open state (that is to say, in a saturation mode in which current is able to flow freely through the first NMOS device 203), the source node 206 is effectively coupled directly to the drain node 204, and thus to the boost voltage 205. The bootstrap charge storage device allows to achieve a fully open state of the first NMOS device 203, by providing a significant positive voltage ($V_{GS}$) across the gate and source nodes 207, 206 that biases the first NMOS device 203 into a saturation mode.

The driver circuit 200 further comprises a high side driver comprising circuitry arranged to output a control signal to the first NMOS device 203. In the illustrated example, the high side driver comprises circuitry in the form of a high side buffer logic gate 216. This high side buffer logic gate 216 is arranged to receive a control signal 217, and to output a corresponding control signal in the form of a bias voltage signal to the gate node 207 of the first NMOS device 203 in accordance with the received control signal 217. The received control signal 217 may be a PWM (pulse width modulated signal). A negative supply voltage connection 218 (V−), which may be a floating or local ground, of the high side buffer logic gate 216 is operably coupled to the output of the NMOS device 203, that is, to the source node 206 in the illustrated example. A positive supply voltage connection 219 (V+) of the high side buffer logic gate 216 is operably coupled to the negative supply voltage connection (V−) 218 of the high side buffer logic gate 216 via the bootstrap capacitor 215. In particular, in the illustrated example a first node 220 of the bootstrap capacitor 215 is operably coupled to the negative supply voltage connection (V−) 218 of the high side buffer logic gate 216 and the source node 206 of the first NMOS device 203, and a second node 221 of the bootstrap capacitor 215 is operably coupled to the positive supply voltage connection (V+) 219 of the high side buffer logic gate 216. In this manner, 'floating' supply voltages are provided to the high side buffer logic gate 216, with V− being tied to the voltage at the source node 206 (that is the output) of the first NMOS device 203, and V+ being determined by the voltage across the bootstrap capacitor 215. Accordingly, by maintaining a suitable charge within the bootstrap capacitor 215, it is possible for the high side buffer logic gate 216 to generate a bias voltage signal at the gate node 207 of the NMOS device 203 sufficiently high to force the NMOS device 203 into its saturation mode.

The bootstrap capacitor 215 may be charged from a regulated voltage supply Vreg 222 via a charging circuit 223. The voltage supply 222 may be provided by the battery of the vehicle in the automotive application. In this example, an output 224 of the charging circuit 223 is operably coupled to the second node 221 of the bootstrap capacitor 215 which, as mentioned above, is also operably coupled to the positive supply voltage input 219 of the high side buffer logic gate 216. The charging circuit 223 acts as a switch so that charging current is permitted to flow from the voltage supply 222 to the bootstrap capacitor 215 during a charging cycle. In one example, the charging circuit 223 is adapted to charge the bootstrap capacitor 215 while the first (high side) NMOS device 203 is pulled down and the second (low side) NMOS device 209 is held ON. The charging circuit 223 may also be adapted to present a high impedance path to the second node 221 of the bootstrap capacitor 215 so that the bootstrap capacitor 215, once fully charged, cannot discharge through the charging circuit either before the first (high side) NMOS device 203 is turned ON or during the period where the first (high side) NMOS device 223 is held ON or during the mode of operation where both first (high side) and second (low side) NMOS devices, 203 and 209, respectively are OFF. This latter mode of operation corresponds to an idle mode of the vehicle.

An example of the charging circuit 223 will now be described in greater detail. An output of the voltage supply 222 is operably coupled to a first switch 224 and an input of a charge pump 225. In this illustrated example, the first switch is a P-channel MOSFET device whose source node 226 is operably coupled to the output of the voltage supply 222. A drain node 227 of the first switch 224 is operably coupled to a second switch 228. The first switch 224 is turned on and off by a control signal applied to its gate 229.

This P channel MOSFET device 224 has a low ON resistance which is advantageous in supplying charging current from the voltage supply 222 to the bootstrap capacitor 215 during a charging phase. A P channel MOSFET device incorporates an inherent "body diode" 224A whose anode is the drain of the device and whose cathode is the source, and thus is in parallel to the current terminals of the P channel MOSFET device 224. This body diode 224A is employed to good effect in the first switch 224 by preventing unwanted flow of current from the voltage supply 222 to the bootstrap capacitor 215 when the first switch 224 is turned OFF during the non-charging phase.

In the illustrated example, the second switch 228 is an N-channel power MOSFET whose source node 230 is operably coupled to the drain node 227 of the first switch 224. A drain node 231 of the second switch 228 is operably coupled to the second node 221 of the bootstrap capacitor 215 and comprises the output 224 of the charging circuit 223. A gate node 232 of the second switch 228 is operably coupled to the output of the charge pump 225 and to a third switching element 233. During a charging phase, the second switch 228 comprising the N channel power MOSFET is turned on by the first switch 224, (which has been set in the on state), and is driven into saturation by the action of the charge pump 225 applying a suitable voltage to its gate node 232. A power MOSFET has a low ON resistance and therefore the second switch 228, being such a device, will have a low voltage drop across it which means that sufficient voltage will be applied to the bootstrap capacitor 215 in order to drive the high side transistor 206 into saturation mode even in low battery conditions. Further, an N channel MOSFET device incorporates an inherent "body diode" 228A whose anode is the source of the device and whose cathode is the drain, and which thus is in parallel to the current terminals of the N channel MOSFET device. This body diode 228A is employed to good effect in the second switch 228 by preventing unwanted flow of current from the bootstrap capacitor 215 back to the voltage supply 222 when the second switch 228 (and the first switch 224) is turned OFF during a non-charging phase.

During an electrical interference event or perturbation it may be that the second switch, 228, that is the N channel power MOSFET, is turned on. In the automotive application, the fuel injector 201 is physically far removed from its control circuitry 200 and any interconnecting wires can couple a lot of electrical noise to the driver circuit components. Particularly during idle mode, both high side and low side switches 203 and 209 are OFF which means that the source high side and drain low side are high impedance nodes. Any RF coupling on the connecting wires between the injector 201 and the control circuit 200 will induce high peak voltages on these nodes. This electrical interference may then be coupled to the charging circuit 223 through the bootstrap capacitor 215. Subsequently, by drain-gate coupling the second switch comprising the N channel power MOSFET 228 may be forced from an OFF state to an ON state (while the first switch 224 is still OFF). This then creates a current path from the bootstrap capacitor 215 through the second switch 228 (on account of its low ON resistance) and thence through the body diode 224A of the first switch 224. This current path can serve as a discharge path from the bootstrap capacitor 215 back to the supply voltage 222. Third and fourth switching elements comprising the charging circuit 223 may be provided in order to prevent this discharge path being established.

The third switching element 233, in this example, is a P channel MOSFET having a source node 234 and a gate node 235 which are operably coupled to one another through a resistor 236. The source node 234 is also operably coupled to the output of the charge pump 225 and to the gate node 232 of the second switch 228. The gate node 235 of the third switching element 233 is also operably coupled to a fourth switching element 237. A drain node 238 of the third switching element 233 is operably coupled to the confluence of the drain node 227 of the first switch 229 and the source node 230 of the second switch 228.

The fourth switching element 237, in this example, is an N-channel MOSFET having a drain node 239 which is operably coupled to the gate node 235 of the third switching element 233. A source node 240 of the fourth switching element 237 is operably coupled to ground. The fourth switching element 233 is controlled by a control signal which is applied to its gate 241.

While the driver circuit 200 is in a non-charging phase or when the injector 201 is operating in idle mode, the second switch 228 is prevented from conducting (if turned on by electro-magnetic interference) by shorting its gate node 232 to its source node 233. A control signal applied to the gate 241 of the fourth switching element 237 turns the fourth switching element 237 on which in turn shorts the gate 235 of the third switching element 233 to ground. The third switching element (P MOSFET) 233 will then turn on, thereby discharging the gate 232 of the second switch (N channel power MOSFET) 228 to its source node 230. The N channel power MOSFET 228 is then effectively configured as a reverse diode so that no current can pass back from the bootstrap capacitor to the voltage supply Vreg. 222.

Figure 3:
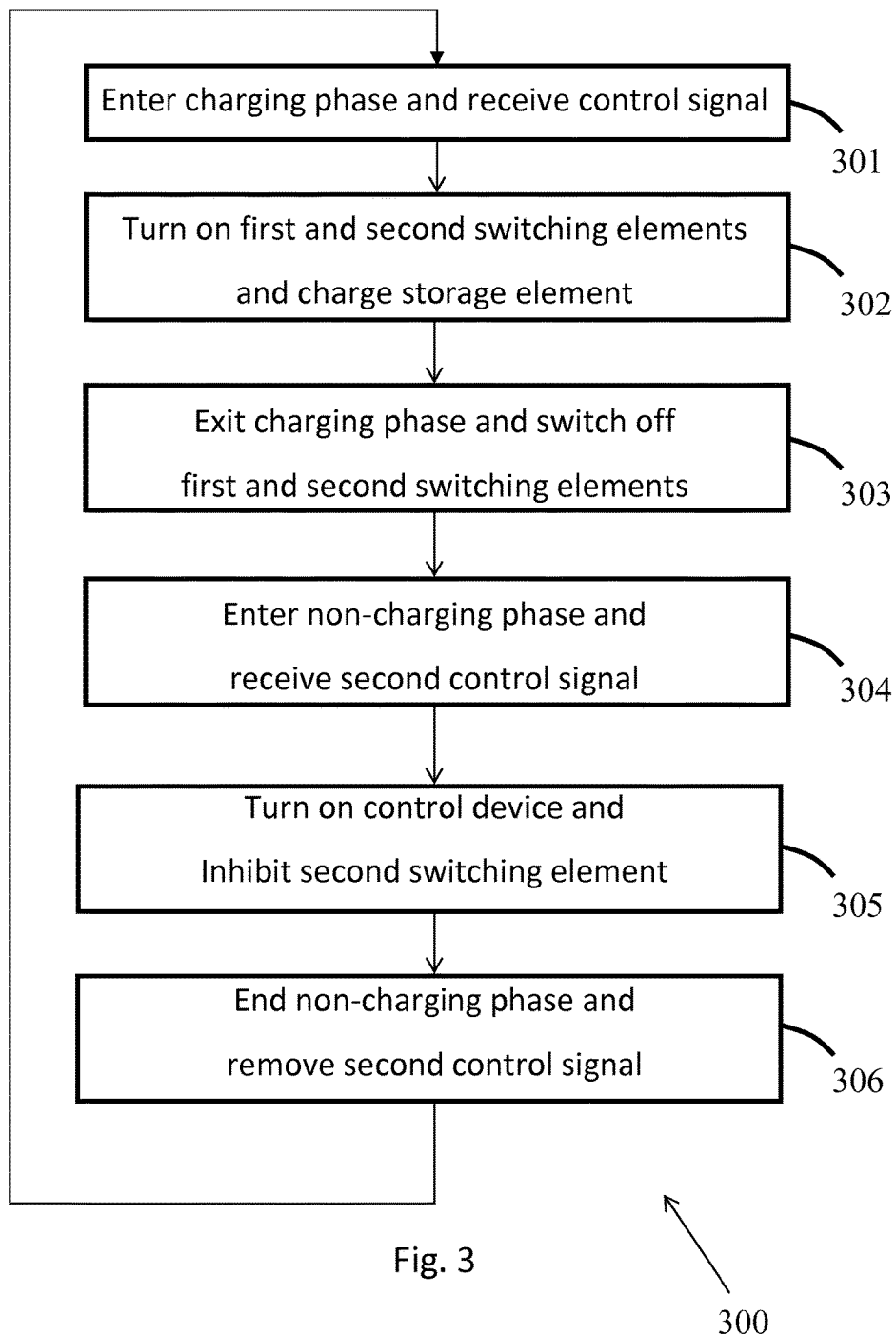
FIG. 3 is a simplified flowchart of an example of a method of charging a bootstrap charge storage element within an inductive load driver circuit.

Referring now to FIG. 3, and FIG. 2 an example of a method 300 of charging a bootstrap charge storage element within an inductive load driver circuit will be described.

At step 301 the driver circuit (200) enters a charging phase and a control signal is received at the gate node 229 of the P channel MOSFET device 224.

When the P channel MOSFET device 224 starts to conduct, this will also turn on the N channel power MOSFET 228 which will be driven into saturation mode owing to the action of the charge pump 225 connected to its gate 232. Hence, current will commence flowing from the voltage supply 222 through the two MOSFET devices 224, 228 and start to charge the bootstrap charge storage element 215 (step 302). In a typical charging phase, the first (high side)

NMOS device 203 is pulled down and the second (low side) NMOS device 209 is held ON.

Once the charging phase has ended and the driver circuit enters a non-charging phase, the control signal is removed from the gate node 229 of the P channel MOSFET device 228 and both the P channel MOSFET device 228 and the N channel power MOSFET 224 turn OFF (step 303).

Also, when the non-charging phase has commenced, a second control signal is applied to the gate node 241 of the N channel MOSFET 237 (step 304).

The second control signal has the effect of turning on the end channel MOSFET 237 which in turn, turns on the P channel MOSFET 233 (which shorts the gate 232 of the N channel power MOSFET 228 to its source 230 (step 305). Shorting the gate to the source prevents the end channel power MOSFET 228 from being turned on by electromagnetic interference which would create a discharge path for the bootstrap charge storage device 215 back to the voltage supply 222.

At the end of the non-charging phase, the second control signal can be removed from the gate 241 of the N channel MOSFET 237 (step 306). Then the whole process may repeat.

In the foregoing specification, the invention has been described with reference to specific examples of embodiments of the invention. It will, however, be evident that various modifications and changes may be made therein without departing from the broader spirit and scope of the invention as set forth in the appended claims. For example, it will be appreciated by those skilled in the art that the NMOS devices of the charging circuit 223 may be replaced with PMOS devices and vice versa provided that the appropriate polarities and interconnections are adjusted as necessary.

Further, although in the example in FIG. 1 the first switch 224 is described as a P channel MOSFET (incorporating a body diode) and the second switch 228 is described as an N channel power MOSFET (incorporating a body diode), these switching elements may be realised by other semiconductor devices with similar properties or indeed an type of switch incorporating a reverse bias device. Similarly, the choice of devices for the third and fourth switching elements 233, 237 respectively is not restricted to the examples shown. Any control arrangement which prevents turn-on of the second switch during a particular mode of operation is envisaged.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the driver circuit 200 may form a part of an engine control unit or may be an independent unit. Alternatively, the examples may be implemented as any number of separate integrated circuits or separate devices interconnected with each other in a suitable manner. For example, the charging circuit 223 may be independent of the rest of the driver circuitry 200.

Also for example, the examples, or portions thereof, may be manufactured by implementing them as soft or code representations of physical circuitry or of logical representations convertible into physical circuitry, such as in a hardware description language of any appropriate type, and subsequently manufacturing physical circuitry according to the representation. For instance, a text model of the driver circuit may first be written, e.g. in VHDL or another hardware description language, and then the model be converted into a mask set suitable to manufacture the display control unit, e.g. by converting the text model into a netlist which in-turn then converted into the layout for the individual masks in the mask set. The mask set may then be used to manufacture the driver circuit.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more"

or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A charging circuit for a bootstrap charge storage element, the charging circuit comprising:
   a switch arrangement, configured to connect between a voltage source and the bootstrap charge storage element, wherein
      the switch arrangement comprises a first switch and a second switch connected in series, and
      said switch arrangement is arranged to allow charging current to flow from the voltage source through the first and second switches to the bootstrap charge storage element to allow the bootstrap charge storage element to charge while both of the first and second switches are turned on;
   the first switch comprising a first reverse bias element in parallel to current terminals of the first switch, wherein said first reverse bias element is arranged to prevent current flow from the power supply to the bootstrap charge storage element when the first switch is turned off;
   the second switch comprising a second reverse bias element in parallel to current terminals of the second switch, wherein the second reverse bias element is arranged to prevent current flow from the bootstrap charge storage element to the voltage source when the second switch is turned off;
   a charge pump coupled to a control terminal of the second switch; and
   a control arrangement coupled to the second switch and arranged to prevent turning on of the second switch while the first switch is turned off.

2. The charging circuit of claim 1, wherein the first switch is a P channel MOSFET device which comprises a body diode and the second switch is an N channel power MOSFET device which comprises a body diode and wherein a drain node of the P channel MOSFET device is coupled to a source node of the N channel power MOSFET device, a source node of the P channel MOSFET device is arranged to receive current from a voltage source, a gate of the P channel MOSFET device is arranged to receive a control signal for turning the P channel MOSFET device either on or off, and a drain node of the N channel power MOSFET device is arranged for connection to the bootstrap charge storage element.

3. The charging circuit of claim 2, wherein the charge pump is coupled to the gate node of the N channel power MOSFET device.

4. The charging circuit of claim 2, further comprising a control arrangement coupled to the N channel power MOS-FET device and arranged to short the gate node of the N channel power MOSFET device to its source node thereby preventing turning on of the N channel power MOSFET device while the P channel MOSFET device is turned off.

5. The charging circuit of claim 4 wherein the control arrangement comprises an N channel MOSFET having a gate node arranged to receive a control signal, and a second P channel MOSFET having a gate node coupled with a drain node of the N channel MOSFET and a source node coupled with the gate node of the N channel power MOSFET device and a drain node coupled to the source node of the N channel power MOSFET device.

6. The charging circuit of claim 1, wherein the charging circuit is implemented in an integrated circuit device.

7. An inductive load control circuit comprising the charging circuit of claim 1.

8. The indicative load control circuit of claim 7, wherein the inductive load is a fuel injector.

9. An internal combustion engine, comprising a fuel injector provided with an injector drive circuit, the injector drive circuit comprising a charging circuit as claimed in claim 1.

10. A vehicle comprising an internal combustion engine as claimed in claim 9.

11. A method of charging a bootstrap charge storage element within an inductive load driver circuit, wherein the bootstrap charge storage element is charged from a voltage supply via first and second serially-connected switches, the method having at least one cycle of a charging phase followed by a non-charging phase and comprising:
   upon entering a charging phase, receiving a first control signal at the first switch, and, in response to receipt of the first control signal, turning on the first and second switches thereby allowing charging current to flow from the voltage supply through the first and second switches to the bootstrap charge storage element to allow the bootstrap charge storage element to charge while both of the first and second switches are turned on;
   during the charging phase, driving the second switch to saturation by a charge pump applying a suitable voltage to a gate of the second switch;
   at the end of a charging phase, removing the first control signal from the first switch thereby turning off the first and second switches;
   upon entering a non-charging phase, receiving a second control signal at a control node of a control arrangement, and, in response to receipt of the second control signal, turning on a control device thereby inhibiting the second switch from turning on, and preventing current flow from the bootstrap charge storage element to the voltage source when the first switch is turned off; and
   at the end of the non-charging phase, removing the second control signal from the second switch.

* * * * *